(12) United States Patent
Lee et al.

(10) Patent No.: US 7,851,843 B2
(45) Date of Patent: Dec. 14, 2010

(54) DRAM CYLINDRICAL CAPACITOR

(75) Inventors: Heng-Yuan Lee, Tainan County (TW);
Chieh-Shuo Liang, Kaohsiung (TW);
Lurng-Shehng Lee, Hsinchu County
(TW)

(73) Assignee: Industrial Technology Research Institute, Hsinchu (TW)

( * ) Notice: Subject to any disclaimer, the term of this patent is extended or adjusted under 35 U.S.C. 154(b) by 269 days.

(21) Appl. No.: 12/248,041

(22) Filed: Oct. 8, 2008

(65) Prior Publication Data

US 2009/0026518 A1    Jan. 29, 2009

Related U.S. Application Data

(62) Division of application No. 11/308,804, filed on May 9, 2006, now Pat. No. 7,456,065.

(30) Foreign Application Priority Data

Dec. 9, 2005   (TW) .............................. 94143538 A

(51) Int. Cl.
*H01L 27/108* (2006.01)
(52) U.S. Cl. ................ 257/309; 257/534; 257/E27.086
(58) Field of Classification Search ................ 257/306, 257/307, 308, 309, 534, E27.086
See application file for complete search history.

(56) References Cited

U.S. PATENT DOCUMENTS

| 6,174,770 | B1 * | 1/2001 | Chi ............................ 438/255 |
| 6,300,192 | B1 * | 10/2001 | Kim ........................... 438/255 |
| 6,358,795 | B1 * | 3/2002 | Tseng ........................ 438/255 |
| 6,677,217 | B2 * | 1/2004 | Joo et al. ..................... 438/398 |
| 6,867,096 | B2 * | 3/2005 | Cho et al. .................... 438/256 |
| 2002/0024080 | A1 * | 2/2002 | Derderian et al. ........... 257/301 |
| 2005/0042823 | A1 * | 2/2005 | Chen et al. .................. 438/255 |
| 2006/0014385 | A1 * | 1/2006 | Kim et al. ................... 438/680 |

\* cited by examiner

*Primary Examiner*—Lex Malsawma
(74) *Attorney, Agent, or Firm*—Jianq Chyun IP Office

(57) ABSTRACT

A structure of a DRAM cylindrical capacitor includes a substrate, a dielectric layer, an amorphous silicon spacer, a polysilicon plug, a HSG layer, a conductive layer and a capacitor dielectric layer. The dielectric layer is disposed on the substrate and includes an opening. The amorphous silicon spacer is disposed on the sidewall of the opening, wherein the polysilicon plug is exposed by the opening. The polysilicon plug includes a notch, and the internal surface of the notch is at the same plane as the internal surface of the amorphous silicon spacer. The HSG layer is disposed on the surface of the amorphous silicon spacer. Furthermore, the conductive layer is disposed on the HSG layer and the capacitor dielectric layer is disposed between the HSG layer and the conductive layer.

12 Claims, 6 Drawing Sheets

DRAM CYLINDRICAL CAPACITOR

CROSS-REFERENCE TO RELATED APPLICATION

This application is a divisional of an application Ser. No. 11/308,804, filed on May 9, 2006, now allowed, which claims the priority benefit of Taiwan application serial no. 94143538, filed on Dec. 9, 2005. The entirety of each of the above-mentioned patent applications is hereby incorporated by reference herein and made a part of this specification.

BACKGROUND OF THE INVENTION

1. Field of the Invention

The present invention relates to a DRAM cylindrical capacitor and a method of fabricating the same. More particularly, the present invention relates to a DRAM cylindrical capacitor and a method of fabricating the same, reduction of yield caused by difficulty in growing a capacitor dielectric layer may be effectively reduced.

2. Description of Related Art

A semiconductor memory mainly comprises a transistor and a capacitor. In a high depth-to-width ratio semiconductor process, the size of the capacitor must be reduced so that it occupies comparatively smaller space in the device. As the memory space required for storage of software grows rapidly, the demand for corresponding increase in the number of capacitors also grows. Accordingly, it highly desired to develop the semiconductor process technology to meet this demand.

At present, larger capacitance may be achieved by increasing the surface area of the bottom electrode of the capacitor. For example, in a conventional cylindrical capacitor, the bottom electrode of the capacitor is made into a cylindrical form, and a Hemispherical Silicon Grain (HSG) structure is formed on the surface of the bottom electrode for increasing the area of the capacitor.

However, as the dimensions of the device proceeds towards further miniaturization, the bottom width of the cylindrical capacitor must be smaller. However, when a HSG structure is formed on the small width cylindrical capacitor, the bottom electrodes may be undesirably connected to each other, and thus the area of the capacitor is reduced.

SUMMARY OF THE INVENTION

The invention is directed to a method for manufacturing a DRAM cylindrical capacitor, wherein the difficulty of forming a capacitor dielectric layer due to the presence of a HSG structure at the bottom of the capacitor may be reduced such that the possibility of undesirable connection between the upper and bottom electrodes can be reduced.

The invention is further directed to a DRAM cylindrical capacitor having a bottom electrode with a larger surface area.

The invention is further directed to a DRAM cylindrical capacitor, wherein HSG structure is not formed at the bottom of the bottom electrode.

The present invention provides a method for manufacturing a DRAM cylindrical capacitor. A substrate having a polysilicon plug formed thereon is provided. A dielectric layer is formed on the substrate. Next, a portion of the dielectric layer is removed such that the opening exposes the polysilicon plug. Next, amorphous Silicon spacer is formed on the sidewall of the opening. Thereafter, a portion of the polysilicon plug is removed and then a seeding method is used to grow a HSG layer on a surface of the amorphous silicon spacer. Next, a capacitor dielectric layer and a conductive layer are sequentially formed on the surface of the HSG layer.

According to an embodiment of the present invention, a metal layer may be further formed on the surface of the HSG layer to serve as a bottom electrode before forming a capacitor dielectric layer on the surface of the HSG layer. According to an embodiment of the present invention, a portion of the metal layer disposed outside the opening may be removed.

According to an embodiment of the present invention, the dielectric layer is removed after the portion of the polysilicon plug is removed but before the HSG layer is formed on the surface of the amorphous silicon spacer. Furthermore, a metal layer may be formed on the surface of the HSG layer to serve as a bottom electrode before the capacitor dielectric layer is formed.

According to an embodiment of the present invention, the step of forming an amorphous silicon spacer on the sidewall of the opening comprises forming an amorphous silicon layer on the substrate to cover the surface of the dielectric layer and the opening and etching the amorphous silicon layer anisotropically to remove a portion of the amorphous silicon layer disposed outside the opening and a portion of the amorphous silicon layer at the bottom of the opening.

According to an embodiment of the present invention, the step of forming the dielectric layer and forming an opening therein comprises sequentially forming an etching stop layer, an inter-layer dielectric layer and a hard mask layer on the substrate; patterning the hard mask to expose a portion of the inter-layer dielectric layer; anisotropically etching the exposed inter-layer dielectric layer using the patterned hard mask as an etching mask until a portion of the etching stop layer is exposed; and removing the exposed etching stop layer to form the opening.

According to an embodiment of the present invention, the capacitor dielectric layer may be formed using an atomic layer deposition (ALD) process.

The invention further provides a structure of a DRAM cylindrical capacitor comprising a substrate, a dielectric layer, an amorphous silicon spacer, a polysilicon plug, a HSG layer, a conductive layer and a capacitor dielectric layer. The dielectric layer is disposed on the substrate, wherein the dielectric layer comprises an opening. The amorphous silicon spacer is disposed on the sidewall of the opening, wherein the polysilicon plug is exposed by the opening. The polysilicon plug comprises a notch, and the internal surface of the notch is at the same plane as the internal surface of the amorphous silicon spacer. The HSG layer is disposed on the surface of the amorphous silicon spacer. Furthermore, the conductive layer is disposed on the HSG layer and the capacitor dielectric layer is disposed between the HSG layer and the conductive layer.

According to an embodiment of the present invention, a metal layer may be further disposed between the HSG layer and the capacitor dielectric layer to serve as a bottom electrode of a metal-insulator-metal (MIM) capacitor, wherein the bottom electrode may be comprised of, for example, TiN, Ru, Pt or TaN.

According to an embodiment of the present invention, the dielectric layer comprises an inter-layer dielectric layer and an etching stop layer disposed between the inter-layer dielectric layer and the substrate.

According to an embodiment of the present invention, the polysilicon plug may be a dual damascene structure.

According to an embodiment of the invention, the conductive layer may comprise, for example, TiN, Ru, Pt or TaN.

The invention further provides a DRAM cylindrical capacitor, comprising a substrate, a polysilicon plug, an amorphous silicon cylinder, a HSG layer, a conductive layer and a capacitor dielectric layer. The polysilicon plug is disposed in the substrate, wherein the polysilicon plug comprises a notch on a top surface thereof. The amorphous silicon cylinder is disposed on the polysilicon plug, and the inside surface of the amorphous silicon cylinder is at the same plane of the inside surface of the notch. Furthermore, the HSG layer is disposed on the surface of the amorphous silicon cylinder, the conductive layer is disposed on the HSG layer, and the capacitor dielectric layer is disposed between the HSG layer and the conductive layer.

According to another embodiment of the present invention, a metal layer is further disposed between the HSG layer and the capacitor dielectric layer, wherein the metal layer may be comprised of, for example, TiN, Ru Pt, or TaN.

According to an embodiment of the present invention, an etching stop layer may be further disposed on the substrate.

According to an embodiment of the present invention, the polysilicon plug may be, for example, a dual damascene structure.

According to an embodiment of the invention, the conductive layer may be comprised of, for example, TiN, Ru, Pt or TaN.

It should be noted that the HSG structure is only grown at the upper surface of the cylindrical capacitor, therefore the difficulty of growing a capacitor dielectric layer on the bottom of the capacitor may be avoided. Thus, the yield can be effectively increased, and also the surface area of the capacitor can be increased.

In order to the make the aforementioned and other features and advantages of the present invention comprehensible, embodiments accompanied with figures are described in detail below.

DESCRIPTION OF EMBODIMENTS

FIGS. 1A to 1H are schematic sectional views of the manufacturing process of the DRAM cylindrical capacitor according to one preferred embodiment of the invention.

Figure 1A:
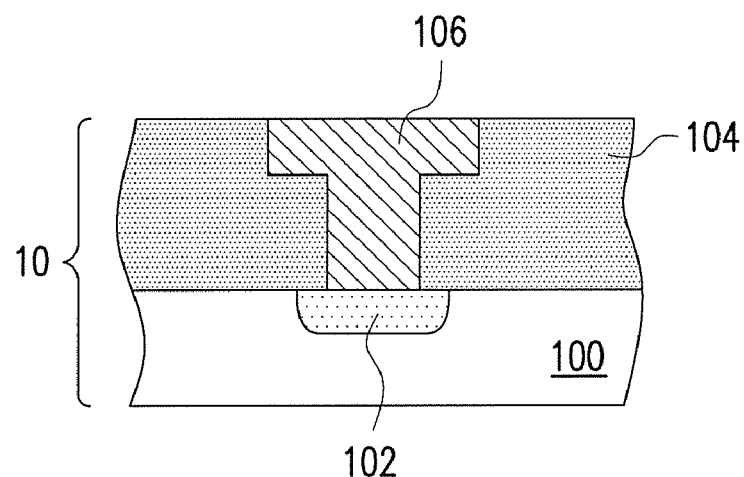
FIGS. 1A to 1H are schematic sectional views of the manufacturing process of a DRAM cylindrical capacitor according to an embodiment of the invention.

Referring to FIG. 1A, first a substrate 10 having a polysilicon plug 106 formed thereon is provided, wherein the substrate 10 may be comprised of a silicon wafer 100 with semiconductor devices formed thereon. A source/drain region 102 may be disposed in the silicon wafer 100 and the polysilicon plug 106 is disposed in an inter-layer dielectric layer (ILD) 104 on the silicon wafer 100, wherein the polysilicon plug 106 is connected to the source/drain region 102. The polysilicon plug 106 may be a dual damascene structure.

Figure 1B:
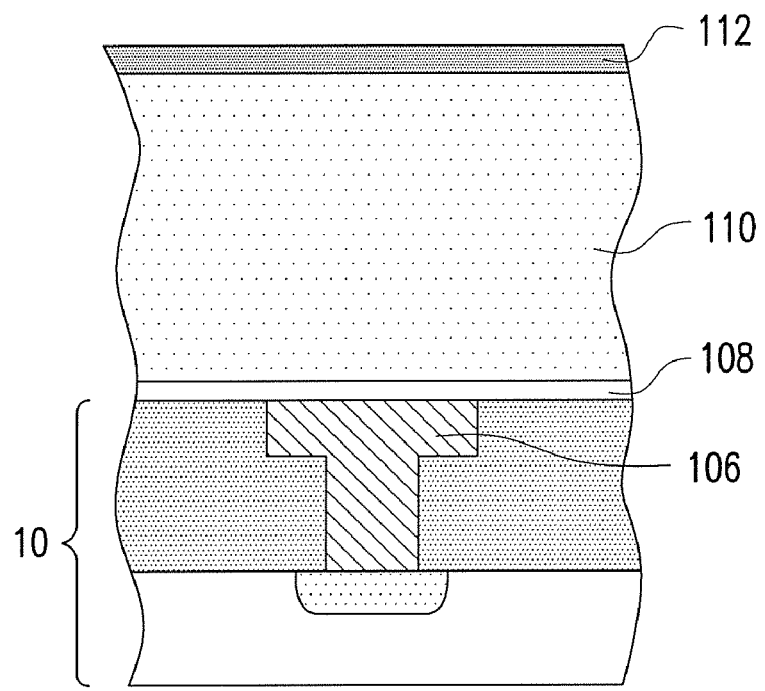

Next, referring to FIG. 1B, a dielectric layer with an opening is formed over the substrate 10. For example, an etching stop layer 108, another ILD 110 and a hard mask 112 may be sequentially formed over the substrate 10.

Figure 1C:
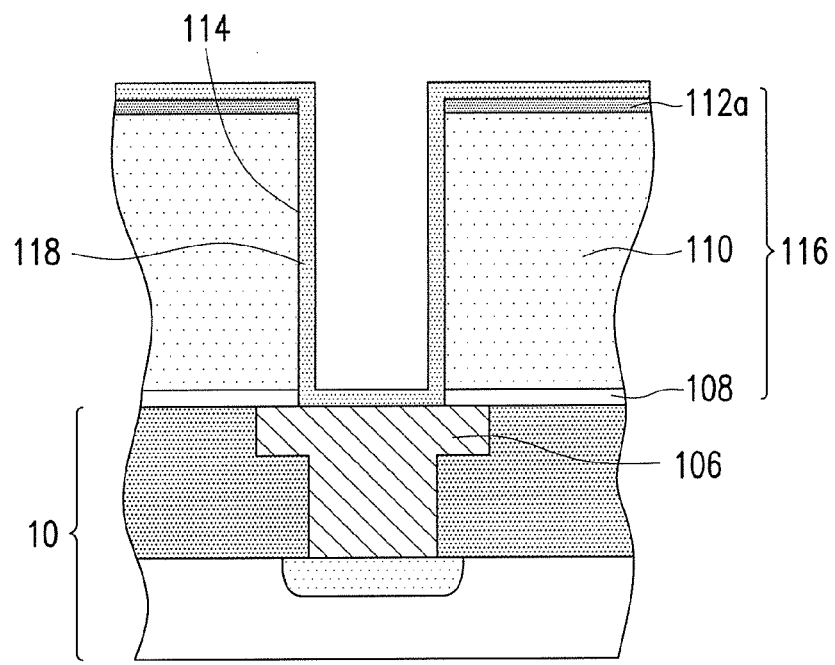

Referring to FIG. 1C, the hard mask 112 is patterned (referring to FIG. 1B) to expose a part of the dielectric layer 110. Next, the exposed ILD 110 is anisotropically etched using the patterned hard mask 112a as an etching mask until a portion of the etching stop layer 108 is exposed. Next, the exposed etching stop layer 108 is removed to form an opening 114 exposing the polysilicon plug 106. Thus, the dielectric layer 116 with the opening 114 is formed. Next, an amorphous silicon layer 118 is formed on the substrate 10 covering the dielectric layer 116 and filling the opening 114.

Figure 1D:
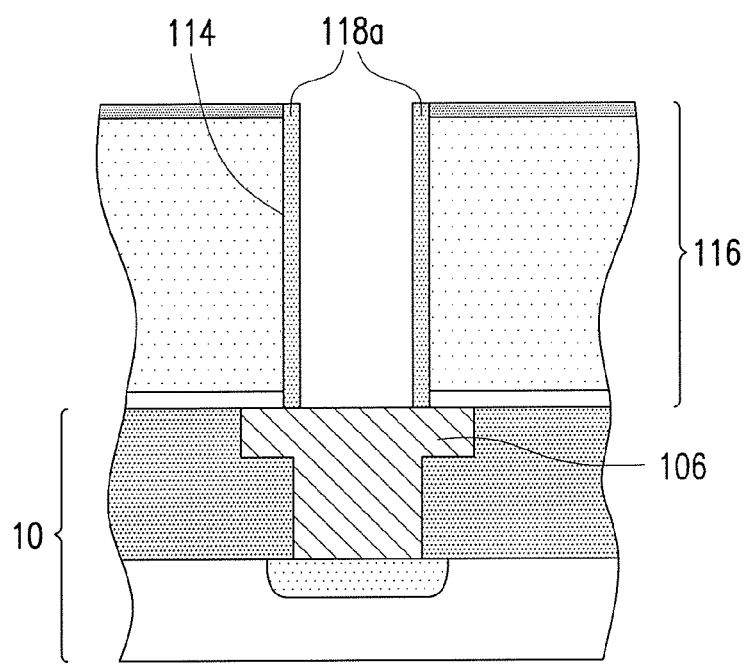

Next, referring to FIG. 1D, the amorphous silicon layer 118 (referring to FIG. 1C) is anisotropically etched to remove a portion of the amorphous silicon layer 118 disposed outside the opening 114 and a portion of amorphous silicon layer 118 the bottom of the opening 114 to form an amorphous Silicon spacer 118a on the sidewall of the opening 114, wherein a portion of the polysilicon plug 106 by the opening 114.

Figure 1E:
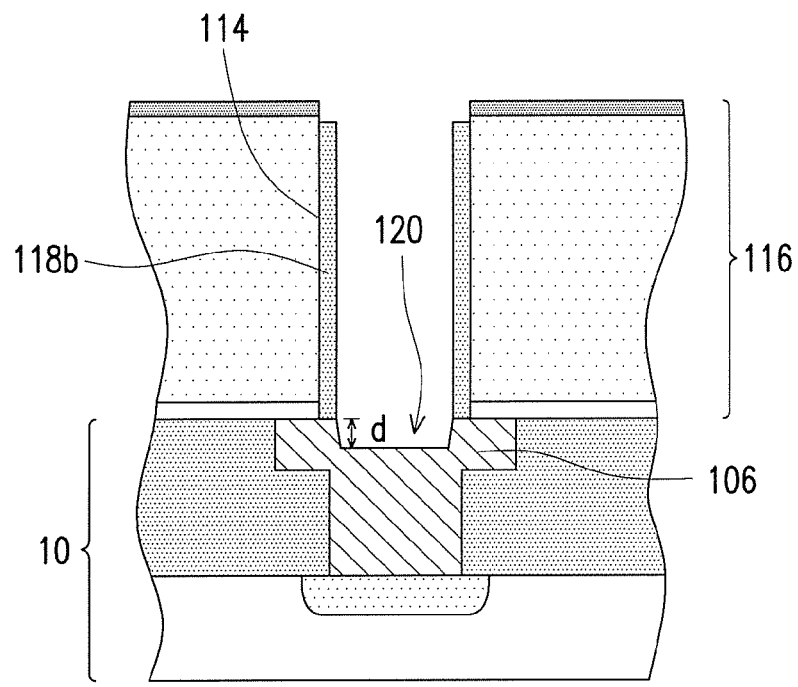

Next, referring to FIG. 1E, a portion of the exposed polysilicon plug 106, for example a thickness d, is partially removed. During the process of removing a portion of the polysilicon plug 106, a portion of the amorphous silicon spacer 118a (referring to FIG. 1D) is also removed and the remaining portion forms the silicon spacer 118b. Therefore, a notch 120 is formed in the top surface of the polysilicon plug 106, wherein the inside surface of the notch 120 is at the same plane as the amorphous silicon spacer 118b.

Figure 1F:
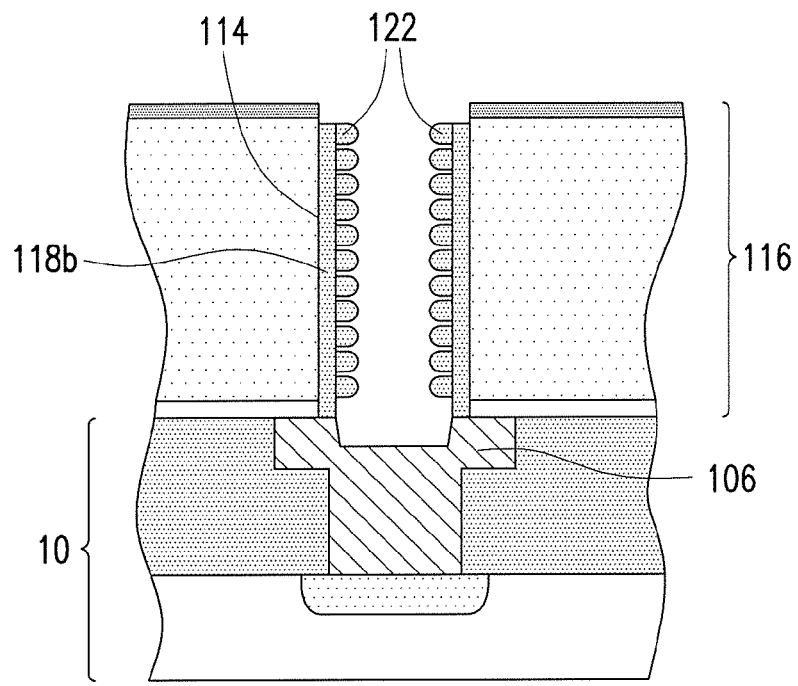

Still referring to FIG. 1F, a seeding method is used to grow an HSG layer 122 only on the surface of the amorphous Silicon spacer 118b.

Figure 1G:
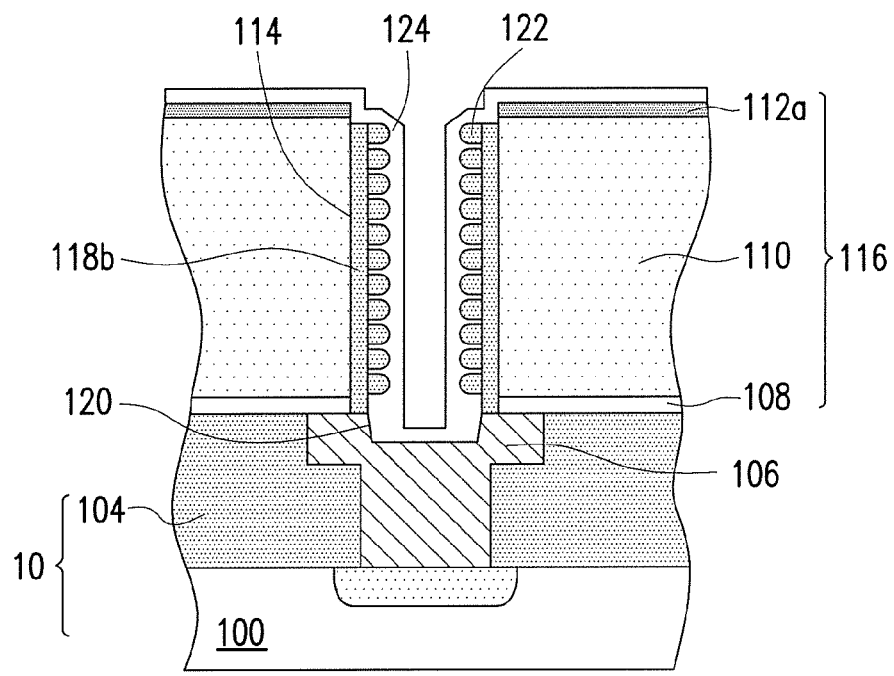

Next, referring to FIG. 1G, a capacitor dielectric layer 124 is formed on the surface of the HSG layer 122 using, for example, an atomic layer deposition film process. The capacitor dielectric layer 124 is formed on the surface of the HSG layer 122 and also covers the surfaces of the patterned hard mask 112a and the polysilicon plug 106.

Figure 1H:
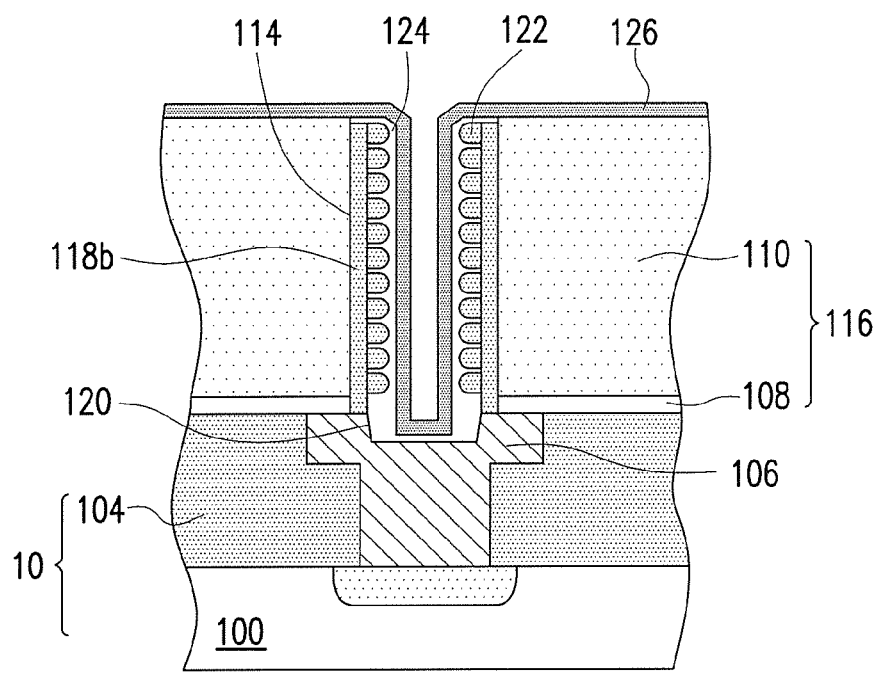

Next, referring to FIG. 1H, the patterned hard mask 112a (referring to FIG. 1G) may be selectively removed first, and portions of the capacitor dielectric layer 124 disposed outside the opening 114 are removed, or vice versa. Next, a conductive layer 126 is formed on the capacitor dielectric layer 124 to serve as an upper electrode, wherein the conductive layer 126 may comprise, for example, TiN, Ru, Pt or TaN. Thus, a metal-insulator-silicon (MIS) capacitor comprising the substrate 10, the dielectric layer 116, the amorphous Silicon spacer 118b, the polysilicon plug 106, the HSG layer 122, the conductive layer 126 and the capacitor dielectric layer 124 is formed. The polysilicon plug 106 is disposed in the substrate 10 below the opening 114. The inside surface of the notch 120 disposed on the top surface of the polysilicon plug 106 is at the same plane as the inside surface of the amorphous silicon spacer 118b.

As described above, the HSG structure is formed only on the top surface of the bottom electrode and the HSG structure is not formed at the inside surface of the bottom electrode, and therefore the possibility of the bottom electrodes undesirably connecting to each other may be effectively avoided. Furthermore, the surface area of the capacitor is increased.

Figure 2:
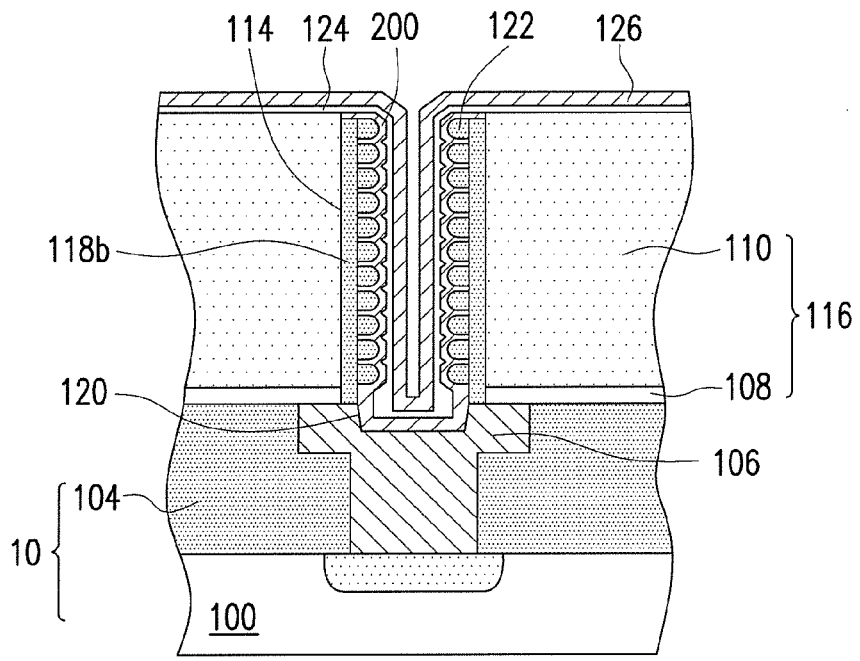
FIG. 2 is a sectional view of the DRAM cylindrical capacitor according to an embodiment of the invention.

Furthermore, a method of fabricating a MIM capacitor according to another embodiment of the present invention is provided with reference to FIG. 2, wherein identical or similar elements are represented by the same element symbols as in the above embodiment.

Referring to FIG. 2, a metal layer 200 may be formed on the HSG layer 122 to serve as a bottom electrode before the capacitor dielectric layer 124 is formed (as shown in FIG. 1G). The step of forming the metal layer 200 may include, for example, depositing a metal layer on the substrate 10 and removing portions of the metal layer disposed outside the opening 114, wherein the bottom electrode comprises, for example, a conductive material such as TiN, Ru, Pt or TaN.

Next, the capacitor dielectric layer 124 is formed, wherein the capacitor dielectric layer 124 comprises, for example, a material with high dielectric constant such as $HfO_2$, $Al_2O_3$, $Ta_2O_5$ or $BaTiO_3$. Furthermore, the metal layer 200 disposed between the HSG layer 122 and the capacitor dielectric layer 124 can be used as the bottom electrode of the MIM capacitor.

Figure 3:
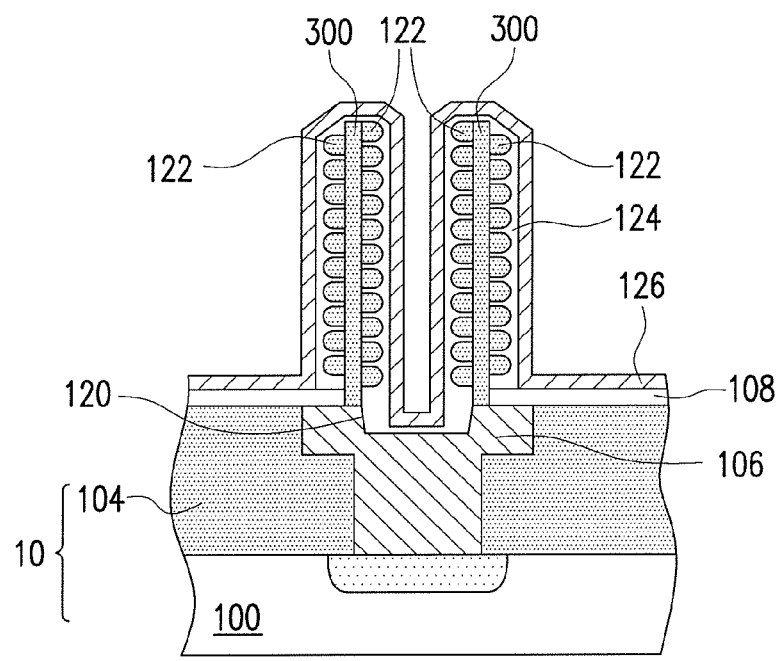
FIG. 3 is a sectional view of the DRAM cylindrical capacitor according to another embodiment of the invention.

Furthermore, a method of fabricating a DRAM cylindrical capacitor according to another embodiment of the present invention is provided with reference to FIG. 3, wherein identical or similar elements are represented by the same element symbols as in the above embodiment.

Referring to FIG. 3, the dielectric layer 116 may be removed after the portion of the exposed polysilicon plug 106 is removed (as shown in FIG. 1E) but before the HSG layer 122 is formed on the surface of the amorphous silicon spacer 118b (as shown in FIG. 1F). The remaining portion of the amorphous silicon spacer serves an amorphous silicon cylinder 300. Thus, a DRAM cylindrical capacitor is formed comprising the substrate 10, the polysilicon plug 106, the amorphous Silicon cylinder 300, the HSG layer 122, the conductive layer 126 and the capacitor dielectric layer 124. The inside surface of the notch 120 formed on the top surface of the polysilicon plug 106 is at the same plane as the inside surface of the amorphous silicon cylinder 300. Moreover, the HSG layer 122 is disposed on the surface of the amorphous silicon cylinder 300 so that the contact area of the bottom electrode of the capacitor can be significantly increased.

Figure 4:
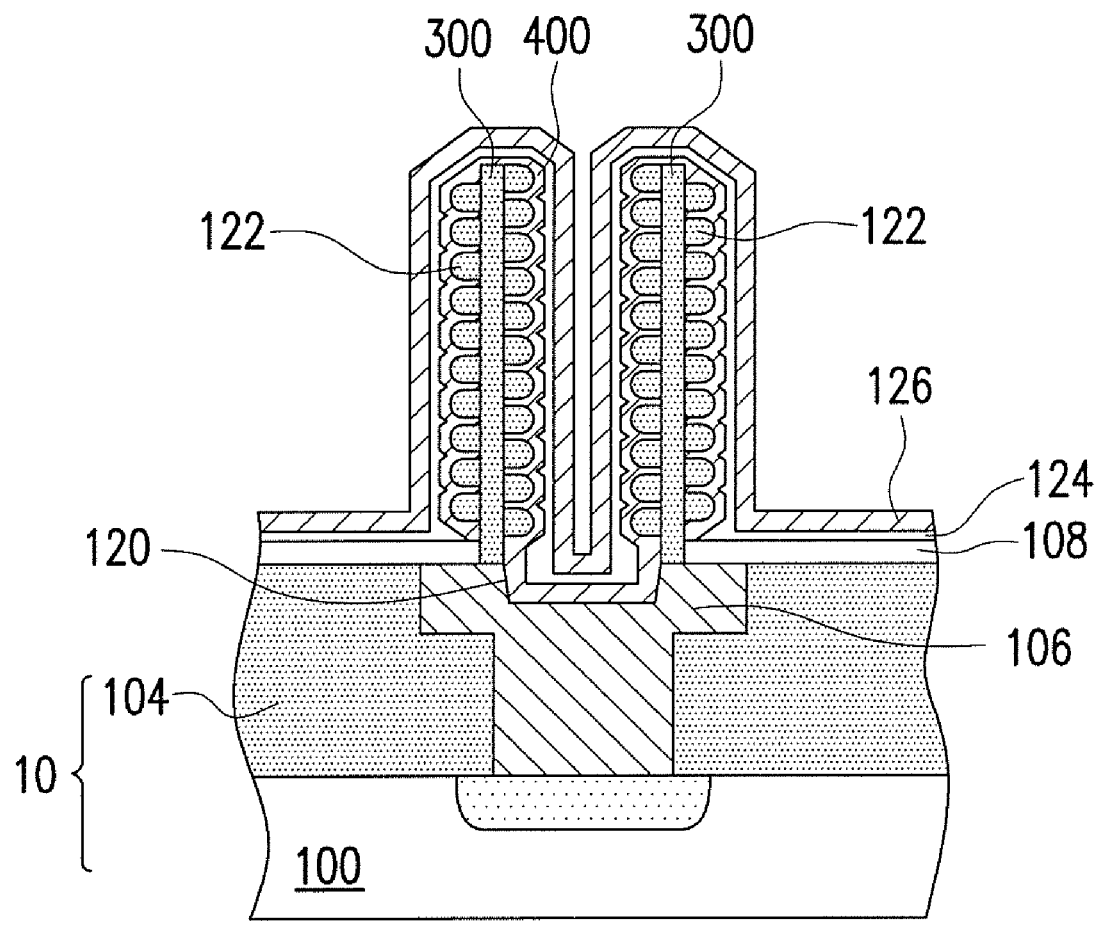
FIG. 4 is a sectional view of the DRAM cylindrical capacitor according to yet another embodiment of the invention.

The present invention further provides a structure of a DRAM cylindrical capacitor according to another embodiment as shown in FIG. 4, wherein identical or similar elements are represented by the same element symbols as in FIG. 3.

Referring to FIG. 4, a metal layer 400 may be formed on the surface of the HSG layer 122 to serve as a bottom electrode of the MIM capacitor before the capacitor dielectric layer 124 is formed. The metal layer 400 may be formed by, for example, depositing a metal layer on the substrate 10, removing portions of the metal layer disposed outside the surface of the HSG layer 122 and forming the capacitor dielectric layer 124.

In view of the above, according to the invention, a notch is formed at the top surface of the polysilicon plug, wherein the inside surface of the notch is at the same plane as the inside surface of the amorphous silicon spacer, and then the HSG layer is grown on the surface of the amorphous silicon spacer. Thus, no HSG structure is formed at the inside surface of the bottom electrode of the formed DRAM cylindrical capacitor. Therefore, the problem of yield reduction caused due shorting of the upper and the bottom electrodes may be effectively avoided. Furthermore, it should be noted that the present invention may also be applied to a MIM capacitor.

Though the present invention has been disclosed above by the preferred embodiments, it is not intended to limit the invention. Anybody skilled in the art can make some modifications and variations without departing from the spirit and scope of the invention. Therefore, the protecting range of the invention falls in the appended claims.

What is claimed is:

1. A DRAM cylindrical capacitor, comprising:
   a substrate;
   a dielectric layer, disposed on the substrate, wherein the dielectric layer has an opening;
   an amorphous silicon spacer, disposed on a sidewall of the opening;
   a polysilicon plug, disposed in the substrate beneath the opening, wherein a top surface of the polysilicon plug has a notch and a inside surface of the notch is at the same plane as a inside surface of the amorphous silicon spacer;
   an HSG layer, disposed on a surface of the amorphous silicon spacer;
   a conductive layer, disposed on the HSG layer; and
   a capacitor dielectric layer, disposed between the HSG layer and the conductive layer.

2. The DRAM cylindrical capacitor as claimed in claim 1, further comprising a metal layer disposed between the HSG layer and the capacitor dielectric layer.

3. The DRAM cylindrical capacitor as claimed in claim 2, wherein the metal layer comprises TiN, Ru, Pt or TaN.

4. The DRAM cylindrical capacitor as claimed in claim 1, wherein the dielectric layer comprises:
   an ILD; and
   an etching stop layer, disposed between the ILD and the substrate.

5. The DRAM cylindrical capacitor as claimed in claim 1, wherein the polysilicon plug comprises a dual damascene structure.

6. The DRAM cylindrical capacitor as claimed in claim 1, wherein the conductive layer comprises TiN, Ru, Pt or TaN.

7. A DRAM cylindrical capacitor, comprising:
   a substrate;
   a polysilicon plug, disposed in the substrate, wherein a top surface of the polysilicon plug has a notch;
   an amorphous silicon cylinder, disposed on the polysilicon plug, wherein a inside surface of the amorphous silicon cylinder is at the same plane as a inside surface of the notch;
   an HSG layer, disposed on a surface of the amorphous silicon cylinder;
   a conductive layer, disposed on the HSG layer; and
   a capacitor dielectric layer, disposed between the HSG layer and the conductive layer.

8. The DRAM cylindrical capacitor as claimed in claim 7, further comprising a metal layer disposed between the HSG layer and the capacitor dielectric layer.

9. The DRAM cylindrical capacitor as claimed in claim 8, wherein the metal layer comprises TiN, Ru, Pt or TaN.

10. The DRAM cylindrical capacitor as claimed in claim 7, further comprising an etching stop layer disposed on the substrate.

11. The DRAM cylindrical capacitor as claimed in claim 7, wherein the polysilicon plug comprises a dual damascene structure.

12. The DRAM cylindrical capacitor as claimed in claim 7, wherein the conductive layer comprises TiN, Ru, Pt or TaN.

* * * * *